US007096995B2

(12) United States Patent
Cox et al.

(10) Patent No.: US 7,096,995 B2
(45) Date of Patent: Aug. 29, 2006

(54) POLYURETHANE FOAM CABINETS

(75) Inventors: David H. Cox, Simi Valley, CA (US); Chen-Hui Huang, Taoyuan (TW)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 10/454,022

(22) Filed: Jun. 4, 2003

(65) Prior Publication Data

US 2004/0069561 A1 Apr. 15, 2004

Related U.S. Application Data

(63) Continuation-in-part of application No. 09/921,563, filed on Aug. 6, 2001, now abandoned.

(60) Provisional application No. 60/389,180, filed on Jun. 17, 2002.

(51) Int. Cl.
*H05K 5/02* (2006.01)
*A47B 81/06* (2006.01)
*H04R 1/02* (2006.01)

(52) U.S. Cl. ........................ 181/199; 181/148; 381/345

(58) Field of Classification Search ................ 181/148, 181/199, 151, 153, 149, 146, 198; 381/345–351, 381/353, 354, 333, 335, 336, 388, 386; 29/594, 29/609.1

See application file for complete search history.

(56) References Cited

U.S. PATENT DOCUMENTS

| | | | | |
|---|---|---|---|---|
| 3,027,040 | A * | 3/1962 | Jodell et al. | 220/62.22 |
| 3,419,455 | A * | 12/1968 | Roberts | 428/36.5 |
| 3,554,315 | A * | 1/1971 | Ohashi | 181/144 |
| 3,793,237 | A * | 2/1974 | Watkinson | 521/112 |
| 3,802,950 | A * | 4/1974 | Stevens | 428/215 |
| 4,025,686 | A * | 5/1977 | Zion | 442/373 |
| 4,031,176 | A * | 6/1977 | Molbert | 264/45.2 |
| 4,053,545 | A * | 10/1977 | Fay | 264/46.4 |
| 4,576,860 | A * | 3/1986 | Fink et al. | 428/314.4 |
| 4,591,020 | A * | 5/1986 | Hruby, Jr. | 181/145 |
| 4,660,830 | A * | 4/1987 | Tomar | 473/601 |
| 4,823,908 | A * | 4/1989 | Tanaka et al. | 181/175 |
| 5,218,176 | A * | 6/1993 | Meyer, Jr. | 181/199 |
| 5,731,555 | A * | 3/1998 | Anagnos | 181/199 |
| 5,874,695 | A * | 2/1999 | Tracy | 181/147 |
| 6,081,602 | A * | 6/2000 | Meyer et al. | 381/99 |
| 6,894,083 | B1 * | 5/2005 | Braun et al. | 521/159 |
| 6,921,571 | B1 * | 7/2005 | Funakoshi | 428/156 |
| 6,958,365 | B1 * | 10/2005 | Dontula et al. | 521/81 |
| 2005/0230027 | A1 * | 10/2005 | Kassa et al. | 156/79 |

* cited by examiner

*Primary Examiner*—Edgardo San Martin
(74) *Attorney, Agent, or Firm*—The Eclipse Group LLP

(57) ABSTRACT

The invention provides a loudspeaker system having a housing made of a plastic casing and a foam positioned against the interior walls of the casing through a reaction between the foam and the interior wall. The foam increases the stiffness of the walls as well as provides sound damping. Additionally, the foam may create a foam rib between a stud and the casing to support the stud and transfer the stiffness of the stud to a wall of the casing.

19 Claims, 7 Drawing Sheets

POLYURETHANE FOAM CABINETS

RELATED APPLICATIONS

This application is a Continuation-In-Part of U.S. patent application Ser. No. 09/921,563, filed Aug. 6, 2001 now abandoned, titled IMPOVED STRUCTURE FOR THE COMPOSITELY FORMED SOUND BOX, and this application also claims the benefit of U.S. Provisional Application Ser. No. 60/389180, filed on Jun. 17, 2002, titled POLYURETHANE FOAM CABINETS.

BACKGROUND OF THE INVENTION

1. Field of the Invention

This invention relates to housings for loudspeaker systems having foam particularly affixed to interior walls of the housing to increase wall stiffness and provide sound damping.

2. Related Art

A loudspeaker typically is a device that converts electrical energy into audible sound. The loudspeaker usually consists of a thin flexible sheet called a diaphragm that moves in response to an electric signal from an amplifier. The diaphragm, the amplifier, and other driver components of the loudspeaker typically are housed in some sort of speaker enclosure. One of the more common types of enclosure is a sealed enclosure, also known as an acoustic suspension cabinet. Acoustic suspension cabinets generally are designed to be completely sealed, so that no air may escape.

In operation, electric signals from the amplifier vibrate the diaphragm. The vibrations create sound waves in the air around the loudspeaker. For example, forward sound waves travel outward into free airspace, while backward sound waves travel into an enclosure. Quality speaker systems typically have sound damping features that prevent noise inside the enclosure from passing outside.

For acoustic suspension cabinets, the internal air pressure of the cabinet is constantly changing during the operation of the loudspeaker. When the diaphragm moves in, the internal air pressure typically is increased and when the diaphragm moves out, the internal air pressure typically is decreased. In other words, the movement of the diaphragm may alternately increase and decrease the pressure level within the cabinet. An efficient speaker system is able to account for the change in pressure in the sealed enclosure to maintain the sound power level.

Some conventional loudspeaker enclosures are designed utilizing wood cabinets that provide stiff, sound damping walls. However, wood typically is prohibitively expensive to manipulate into structural shapes that house certain speaker configurations or ornamental shapes that are pleasing to a consumer-driven market. In addition, in many applications, wood cabinets take too long to produce and cannot be utilized in high volume production.

By way of comparison, plastic provides cabinet designers with the freedom to house a multitude of speaker configurations as well as create consumer-driven ornamental shapes. In addition, manufacturers may rapidly produce plastic cabinets, making them ideal for high volume production runs. Thus, many modern speaker cabinets are made of plastic.

Although the utilization of plastic for speaker cabinets typically is superior in industrial design over wood, the utilization of plastic for speaker cabinets gives rise to wall flex and sound damping problems. For example, certain speaker configurations require plastic cabinet walls having multiple inches. However, molding cycle time and process yield problems require that the thickness of these plastic walls not exceed 0.187 to 0.250 inches. The result is a long, thin expanse of plastic.

A long, thin expanse of plastic potentially creates a large, weak surface that may flex in and out in,along with the diaphragm. As the cabinet walls flex in and out, they alter the interior volume of the sealed cabinet away and result in differing pressures within the interior. The driver typically will draw more current and work harder to counter the harmonic energy of the wall movements to maintain the desired sound power level. However, as the wall becomes stiffer, the driver requires less current to compensate for wall movement to make the overall system more efficient. Thus, it is desirable to minimize the movement of the plastic walls. Here, increasing the flexural rigidity of the plastic walls decreases their ability to move.

Injected molded plastic ribs have been utilized in the past to make plastic cabinet walls more rigid. Unfortunately, larger plastic walls require large, thick ribs. If the plastic ribs are too thick, then the thick ribs create undesirable sink marks on the exterior of the cabinet. Additionally, ribs alone will not provide the sound damping needed in a quality speaker system. Therefore, there is a need to stiffen the walls of a loudspeaker plastic enclosure while damping sounds internally generated within the plastic enclosure.

SUMMARY

This invention provides a technique to stiffen the walls of a loudspeaker plastic enclosure while damping sounds internally generated within the plastic enclosure. In particular, the invention includes a housing made of a plastic casing and a foam particularly positioned against the interior walls of the casing. The foam increases the stiffness of the walls as well as provides sound damping. The foam may create a foam rib between a stud and the casing to support the stud and to transfer the stiffness of the stud to a wall of the casing.

The casing may be made of high impact polystyrene. The foam may be an expandable foam having properties that fix the foam to the casing. Additionally, the foam may be made of a crosslinked polyurethane or polyethylene composition having ingredients. In one example composition of the foam, the polyurethane foam may include 40% to 70% by weight diphenylmethane diisocyatuane, 40% to 70% by weight polymeric, and 7% to 13% by weight chlorodifluoromethane to total 100% by weight. A catalyst may be added to control a cure rate of the foam. When the foam cures, the foam preferably has an average thickness of approximately 8.0 to 10.0 millimeters.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis being placed instead upon illustrating the principles of the invention. In the figures, like reference numerals designate corresponding parts throughout the different views.

DETAILED DESCRIPTION

Figure 1:
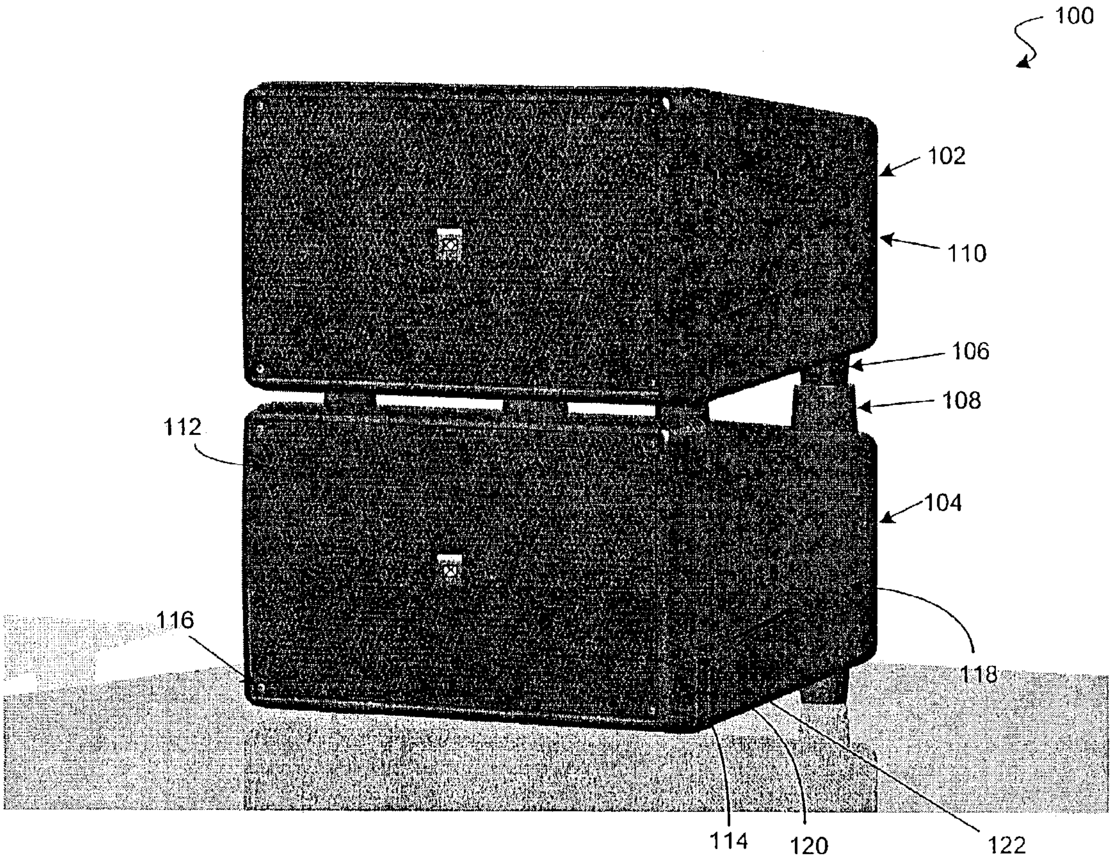
FIG. 1 is an isometric view illustrating a stack of speaker systems.

FIG. 1 is an isometric view illustrating a stack of speaker systems. The stack 100 is shown with a speaker system 102 placed on top of a speaker system 104 with a foot 106 located in a shoe 108. Four feet 106 may be provided so that the speaker system 104 may be located on a surface, such as a shelf or the floor.

Figure 5:
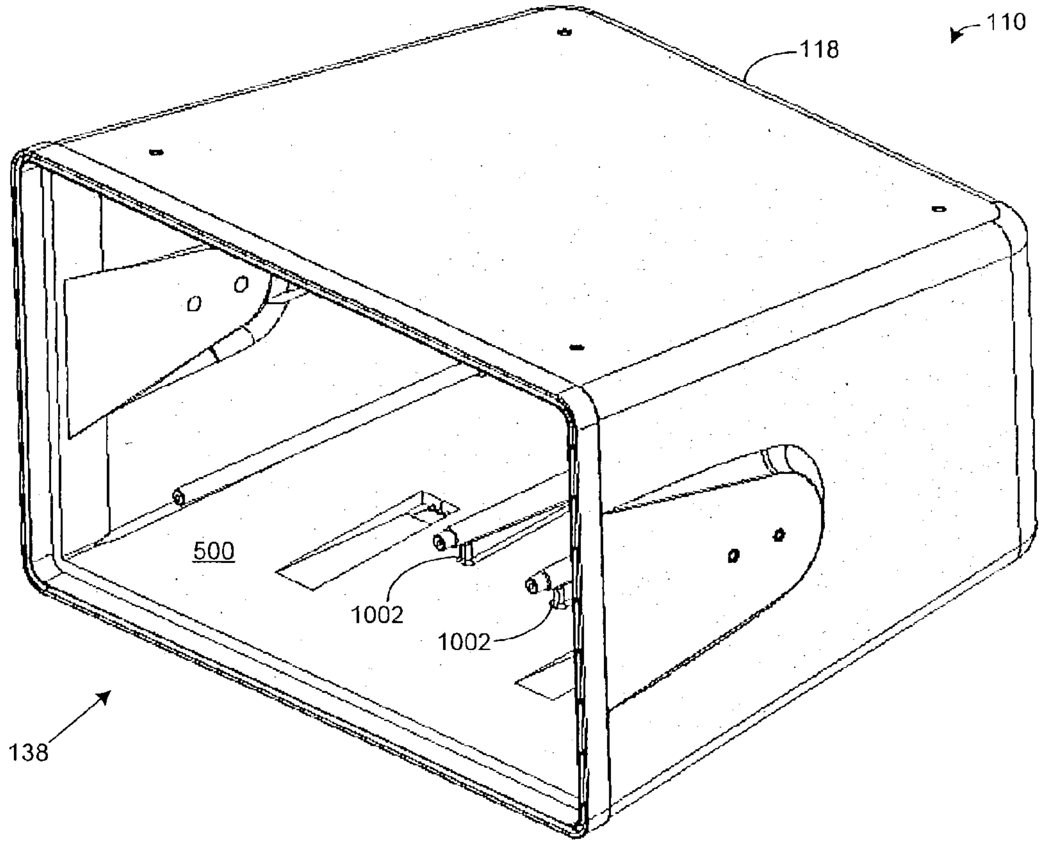
FIG. 5 is an isometric view illustrating a housing after the application of a foam.

Each speaker system 102, 104 may include a housing 110 and a grill 112 mounted to a baffle board 114 by screws 116. The housing 110 may include a casing 118 and a foam 500 (FIG. 5). The foam 500 may function to increase wall stiffness of the casing 118 as well as provide damping against sounds generated within the housing 110. A bezel 120 may be formed as part of a front face of the casing 118 to provide a registration surface 122 for the baffle board 114.

Figure 2:
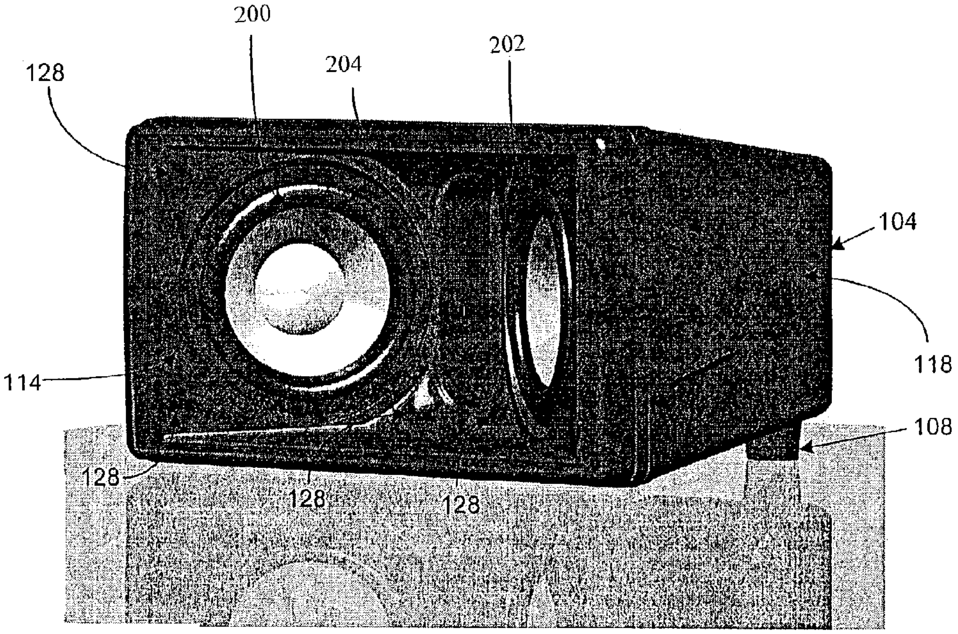
FIG. 2 is an isometric view illustrating a speaker system with a grill removed.

FIG. 2 is an isometric view illustrating the speaker system 104 with the grill 112, removed. Fixed to the baffle board 114 may be a driver 200 and a driver 202. These drivers may include a diaphragm, a voice coil, a ring-shaped permanent magnet and other elements to move the diaphragm and create audible sound. For example, the driver 200 and the driver 202 may be woofers that offer a warm, punchy low-end sound. Each woofer may be a ten-inch (254 millimeter) aluminum/ceramic composite cone woofer that may exhibit a total power handling capability of 400 watts continuous (1600 watts peak). Alternatively, the driver 200 may be a midrange speaker or a subwoofer and the driver 202 may be a tweeter.

The baffle board 114 may be affixed to the casing 118 by a plurality of screws. As seen in FIG. 2, each screw may be hidden behind a cover 204. Each cover 204 may aid in making the speaker system 104 air-tight and enhance the ornamental appearance of the baffle board 114. In other example implementations, a plurality of pins, nuts and bolts, welds, glue, or a combination of screws, a plurality of pins, nuts and bolts, welds, glue may be employed to affix the baffle board 114.

Figure 3:
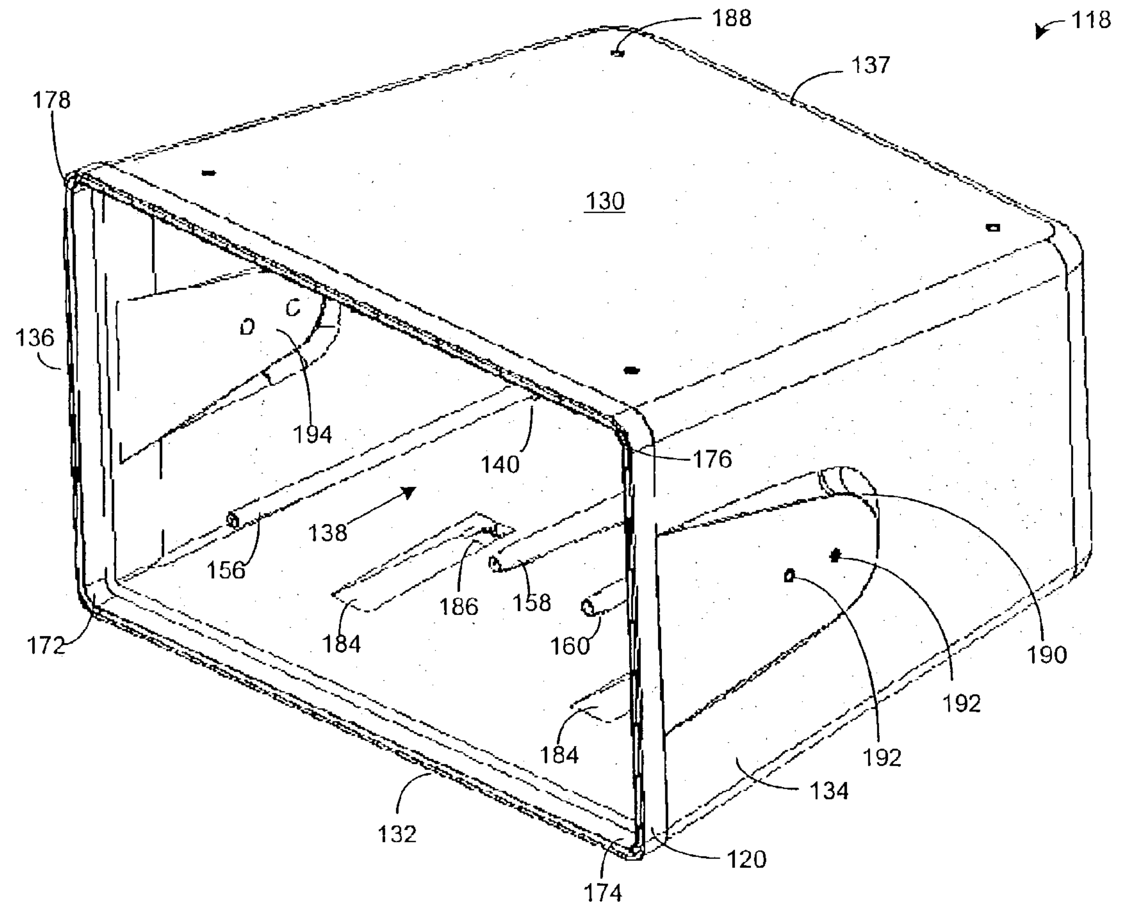
FIG. 3 is an isometric view illustrating a casing.
Figure 4:
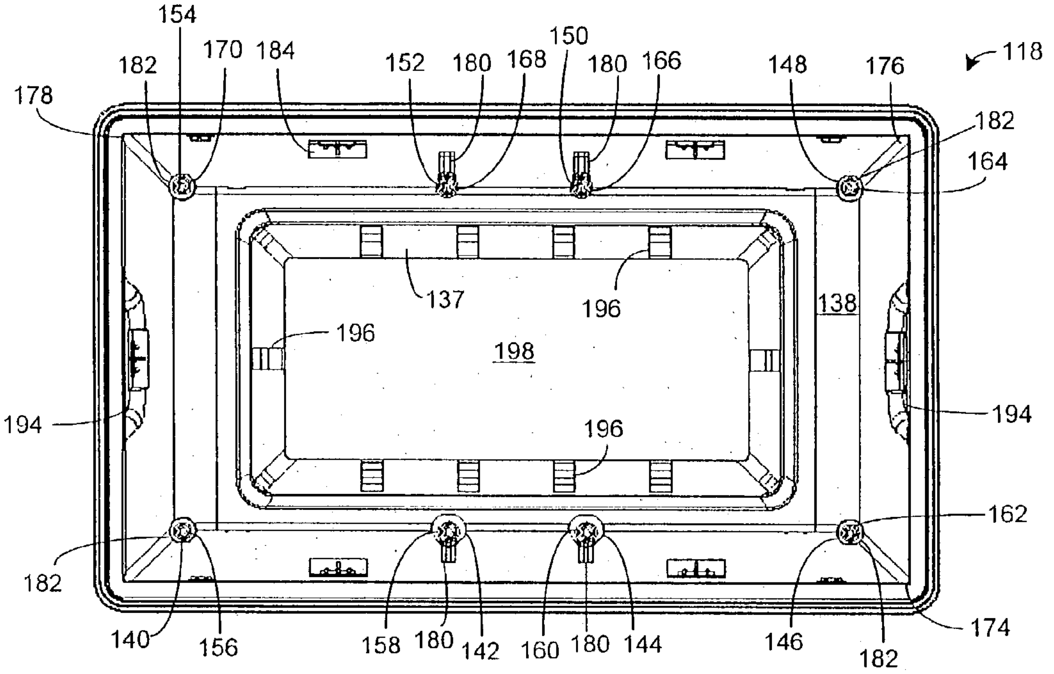
FIG. 4 is a front view illustrating the casing.

FIG. 3 is an isometric view illustrating the casing 118 and FIG. 4 is a front view illustrating the casing 118. The casing 118 may be made of a material that may be molded into shape. For example, the casing 118 may be made of a plastic, such as a high impact polystyrene (HIPS). To add some rigidity to the material of the casing 118, the casing 118 may include 5% to 15% by weight of glass. In other example implementations, alternate material such as ceramics maybe added to the material to add some rigidity.

The casing 118 may include a top wall 130, a bottom wall 132, a sidewall 134, a sidewall 136, and a rear panel 137 arranged to form an interior 138. It is within this interior 138 that the foam 500 (FIG. 5) may be positioned.

The casing 118 may include a plurality of mold features, such as bosses, gussets, fillets, radii, and ribs and a plurality of hardware, such as studs and inserts. For example, the casing 118 may include bosses 140, 142, 144, 146, 148, 150, 152, and 154. The bosses 140–154 may be protruding posts that aid in assembling the casing 118 to the baffle board 114. Typically, the bosses 140–154 may include a hollowed-out portion to receive hardware. For example, the bosses 140–154 may be utilized to aid the fastening of the baffle board 114, for example, self-tapping screws, drive pins, expansion inserts, cut threads, and plug and force fits. Each boss 140–154 may include a stud, such as studs 156, 158, 160, 162, 164, 166, 168, and 170. Each stud 156–170 may be a metal tube that is threaded on the interior to receive a mounting screw passed through the baffle board 114 and knurled on an exterior portion to form an interference fit within each boss 140–154.

The studs 156–170 may be of varying length. For example, the studs 156, 162, 164, and 170 may be longer than the studs 158, 160, 166, and 168. One reason for this is that it is difficult to mold long bosses near the fillets 172, 174, 176, and 178. Thus, the studs extending from the bosses 142, 144, 150, and 152 may be longer than the studs extending from the bosses 140, 146, 148, and 154.

The bosses 140–154 are subjected to different forces, strains, and stresses not typically found in other sections of the casing 118. Stiffening the bosses 140–154 may function to react positively against these different forces, strains, and stresses. For example, a rib 180 may elevate each boss 142, 144, 150, and 152. By way of explanation and not limitation, the ribs 180 may be viewed as longitudinal protrusions affixed to the casing 18 to add strength to the casing 118, to minimize warpage in the casing 118, and to stiffen the bosses 142, 144, 150, and 152.

As seen in FIG. 3 and FIG. 4, each of boss 140, 146, 148, and 154 are positioned adjacent to an interior corner of the casing 118. Here, rather than a rib, each of boss 140, 146, 148, and 154 may be stiffened by a gusset 182. A gusset functions as a reinforcing plate that may extend from a first wall surface to an adjacent second wall surface to further support and improve their structural integrity. The gussets 182 may additionally function to stiffen the bosses 140, 146, 148, and 154.

The casing 118 may have a variety of sizes and shapes. For example, a depth of the casing 118 may be approximately twenty-four inches. A dimension of the bezel 120 may be approximately twenty-four inches long by approximately fourteen inches high, with a wall thickness of approximately 0.187 to 0.250 inches. An expanse of thin plastic wall, such as over twenty-four inches, may create a weak structure.

To stiffen the walls of the casing 118, the casing 118 may include a plurality of draft reliefs 184, each of which may lead to a nest 186. A vertical reinforcing bar (not shown) may be urged into each of the two facing nests 186 to aid in further stiffening the casing 118. An additional horizontal reinforcing bar (not shown) may extend from the sidewall 134 to the sidewall 136 behind the two vertical reinforcing bars.

The casing 118 may also include inserts 188, U-shaped channels 190, and inserts 192. The inserts 188 may be utilized in conjunction with eyebolts (not shown) to suspend the speaker system 104 (FIG. 2) from underneath a bookshelf, for example. U-brackets (not shown) may be placed around the U-shaped channels 190 and attached to the inserts 192 on the sidewall 134 and the sidewall 136 of the casing 118 to allow easy installation of the speaker system 104 on walls and ceilings.

To avoid creating walls that are too thick, the formation of the U-shaped channels 190 may result in the formation of U-shaped indentations 194. As seen in FIG. 3, the U-shaped indentations 194 face the interior 138 of the casing 118 and expose an end of each insert 192 to the interior 138.

As seen in FIG. 4, the casing 118 further may include ribs 196 on the rear panel 137. The ribs 196 may surround a rear opening 198 in the casing 118. The rear opening 198 may be configured to receive a network plate (not shown) having a printed circuit board and cables that connect to the driver 124 and the driver 126. The ribs 196 may function to strengthen the rear panel 137 against forces applied by the weight of the cables.

Figure 6:
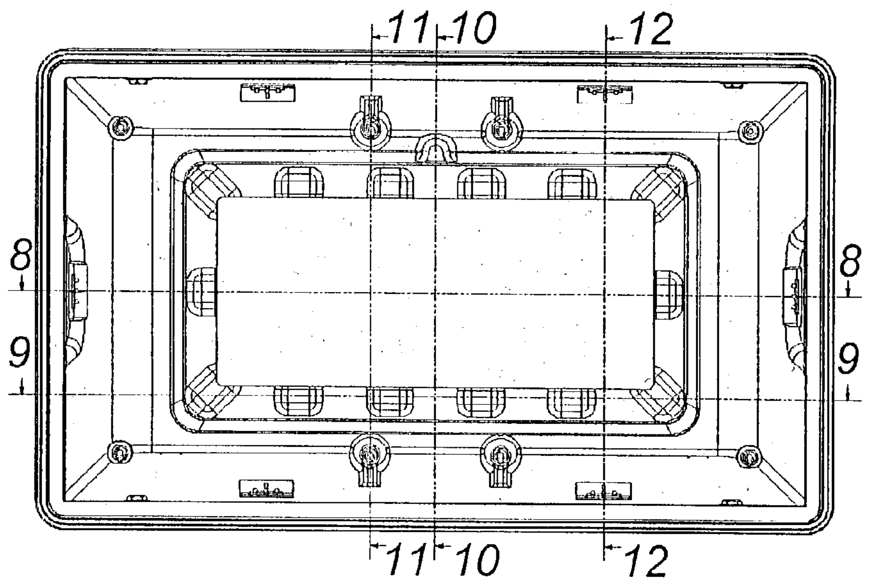
FIG. 6 is a front view illustrating the housing after the application of the foam.

FIG. 5 is an isometric view illustrating the housing 110 after the application of foam 500 and FIG. 6 is a front view illustrating the housing 110 after the application of foam 500. Certain portions of the interior 5004 and the mold features within the interior 138 may be covered with the foam 500. In production, the foam 500 may be applied to the interior 138 of the casing 118 to form the housing 110. The foam 500 may include properties that function to increase wall stiffness and provide sound damping. When applied to the surfaces of the interior 138, the material preferably may follow the contours of the interior 138 and may adhere to the surfaces of the interior 138 in one step.

The foam 500 may be described as being in at least two states: a pre-application state and a post-application state. In the pre-application state, the foam 500 may be a wet foam or a liquid foam and in the post-application state, the foam 500 may be a dry foam. The terms wet foam, liquid foam, and dry foam in general represent two states of the foam and need not be taken for their literal meaning. The foam 500 may be expandable liquid in the pre-application state.

In general, the foam 500 may be a thermal plastic or thermal set material. For example, the foam 500 may be a polyurethane foam composition having ingredients. Before applying the foam 500 to the interior 138 of the casing 118, the polyurethane foam composition may include 40% to 70% by weight diphenylmethane diisocyatuane. The polyurethane foam composition also may include 40% to 70% by weight polymeric and 70% to 13% by weight chlorodifluoromethane to total 100% by weight. There may be additional ingredients in the polyurethane foam composition.

The polyurethane foam preferably is a crosslinked polyurethane foam, but may be uncrosslinked. A crosslinked polyurethane foam typically has a strong bound molecular structure e like a textile with tight meshes. The crosslinking of polyurethane foam makes it possible to obtain finer cells and thermoplastic properties useful for the operations of press forming or vacuum forming. The molecular structure of an uncross linked polyurethane foam is not so tight—like a non-woven material or geotextile—but is less expensive than crosslinked polyurethane foam.

These additional ingredients may be nonreacting ingredients. The foam 500 and the casing 118 may be made of materials so that the foam 500 chemically reacts to the casing 118 to by adhering to the casing 118 without the utilization of an adhesion promoter in the foam 500. For example, a polyurethane foam composition may chemically react with high impact polystyrene to adhere to that high impact polystyrene without the utilization of an adhesion promoter. The foam 500 additionally may include an adhesion promoter. The foam 500 may additionally include a catalyst to control the reaction profile and adjust the cure rate of the foam 500. Examples of the foam 500 may include a polyethylene foam composition, a styrofoam, or a high-grade composite material.

In any acoustic environment, there may exist to some extent two distinct acoustic field: the direct field and the reverberant field. As sound emanates from the source it has a sound pressure and the space between where the sound emanates and before it strikes any surface is a direct field. One variable that affects direct field sound pressure is known as the "quality factor" or "Q factor."

In general, the Q factor is a measure of the acoustic losses in a resonance system. The Q factor is a coefficient multiplied into the acoustic power to account for reflected energy if the source is placed near a surface or corner. For an omnidirectional source in free space, Q equals one. For an omnidirectional source placed at a plane surface, Q equals two because a receiver in the area would perceive both the direct acoustic wave and the wave immediately reflected from the wall. For a source in a two-dimensional corner (i.e. the intersection of two walls), Q equals four. In a three-dimensional corner, Q equals eight. Theoretically, this term may apply to omnidirectional sources placed infinitesimally close to a perfectly reflecting surface so that the reflected energy is indistinguishable from the direct field.

For sounds generated within the interior 138 of the housing 110, it is desirable that the wall structure have as low of a Q factor as possible to minimize the passage of sound through the walls. Glass-filled high impact polystyrene generally exhibits a Q factor of approximately fifty-five. With such a high Q factor, most interior sounds may be reflected and pass through glass-filled high impact polystyrene.

After applying the foam 500 to the interior 138 of the casing 118 and when the foam 500 resides in its cured, dry state, the foam 500 may identify a low Q factor. The Q factor of the housing 110 with the dry foam 500 may be approximately in a range of twenty-five to thirty. If the Q factor of the foam 500 exceeds this range, then the sound damping quality generally will be poor.

Figure 7:
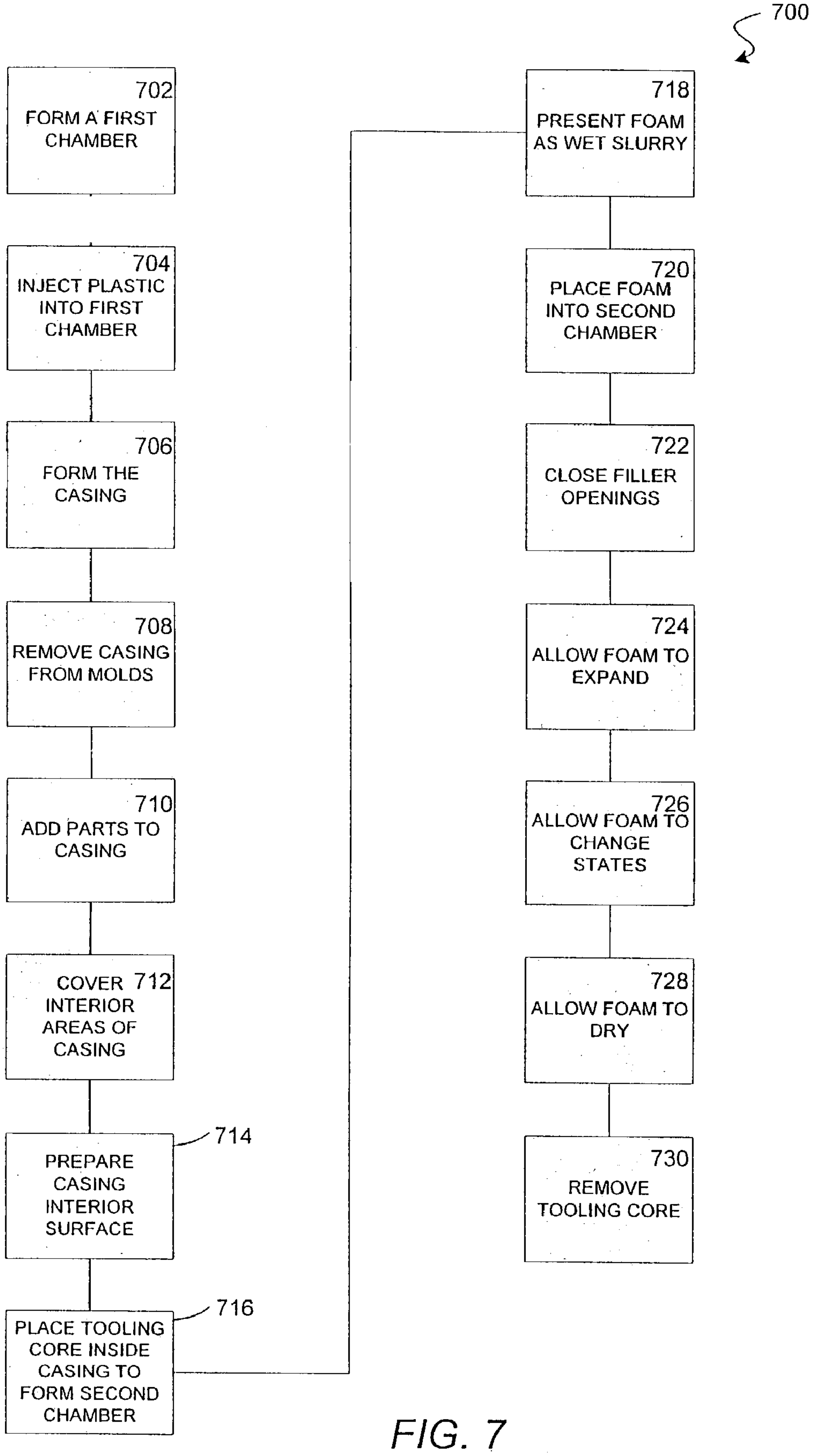
FIG. 7 is a flow chart illustrating a methodology to form the housing.

FIG. 7 is a flow chart illustrating a methodology in an example process to form the housing 110. In this method 700, a first injection molded process may form the casing 118 by the following steps. At step 702, a cavity mold may be placed inside a core mold to form a first chamber. At step 704, hot, melted plastic may be injected into the first chamber. At step 706, the hot, melted plastic may be allowed to cool to form the casing 118. At step 708, the core mold and the cavity mold may be moved away from the casing 118. At step 710, inserts and other parts may be added to the casing 118. The inserts and other parts may be added either before injecting the plastic into the first chamber (step 704) or after moving the molds away from the casing 118 (step 708).

The casing 118 then may be put through to a second operation. At step 712, areas within the interior 138 of the casing 118 may be covered. This may include covering the openings of the studs, the inserts, a mating surface of the bezel, the draft reliefs, and the nests. At step 714, the surface of the interior 138 may be prepared by removing any contaminants that will interfere with full development of adhesion of the foam 500 to the surfaces of the interior 138.

At step 716, a tooling core may be placed inside the interior 138 to form a second chamber. The second chamber may form a gap that may vary throughout the second chamber. This gap may establish the thickness of the dry liquid foam at particular locations. The collective of the thickness at each location may average out to a thickness of approximately 8.0 millimeters (mm) to 10.0 mm (0.3 inch to 0.4 inch). If the thickness of the foam 500 is much greater than 10.0 mm, then the per-unit cost typically becomes prohibitively expensive. If the thickness of the foam 500 is much less than 8.0 mm, then the foam 500 will not provide sufficient flexural rigidity to maintain an efficient driver 124 (FIG. 2) or an efficient driver 126.

The profile of the tooling core may emulate the details of the interior 138 at reduced dimensions. Portions of the tooling core may cover areas within the interior 138 of the casing 118. The tooling core may include a filler opening and at least one vent.

At step 718, the foam 500 may be presented as a wet slurry. At step 720, the foam 500 may be placed into the second chamber through the filler opening of the tooling core. The liquid foam may be poured into the second chamber. Alternatively, the liquid foam may be injected into the second chamber. Additionally, a gas such as nitrogen may be injected into the second chamber at selective, preprogrammed pressures. This may force the wet foam 500 against the tooling core and the casing 118 to fill or pack out the second chamber during the process. This gas assistance may function to permit the formation of a dry foam 500 having a better surface finish and more predictable density.

At step 722, the filler opening may be closed. At step 724, the liquid foam 500 may expand to fill the second chamber. As the liquid foam 500 expands, the foam 500 may give off heat relative to its surrounding environment in an exothermic reaction. The molecular structure of the foam 500 may begin to crosslink with itself and the surface of the casing 118. As the expanding molecular structure crosslinks, the forming structures may locally trap air. This trapped air may function as a blowing agent to reduce the material density in such a way that the material may provide stiffness and the blowing agent may provide sound damping. Preferably, the tooling core may be made of a material that generally does not react with or adhere to the foam 500. Thus, an outer cellules wall or skin may be formed at the juncture between the tooling core and the foam 500. This skin may function to dampen incident sound energy. The culmination of flexural module in the cellular structure of the foam 500 may give good damping property.

Figure 11:
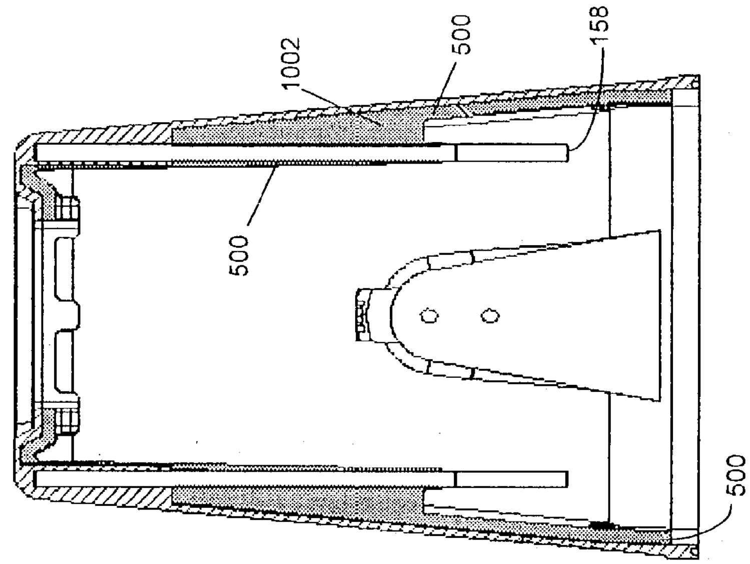
FIG. 11 is a section view taken off line 11—11 of FIG. 6 illustrating a fourth section of the housing.
Figure 10:
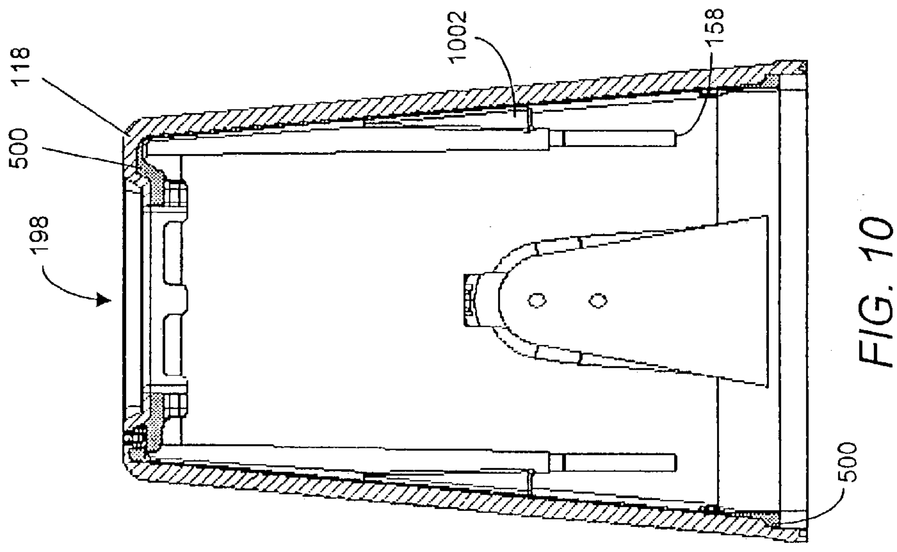
FIG. 10 is a section view taken off line 10—10 of FIG. 6 illustrating a third section of the housing.

As the liquid foam expands and fills the second chamber, the excess liquid foam material may bleed out through the vents in the tooling core to control the liquid foam density. The expanding liquid foam 500 may form around features within the interior 138, such as the bosses and the ribs to strengthen these features. For example, the foam 500 may encapsulate the stud to form a rib 1002 (FIG. 10 and FIG. 11). At step 726, the foam may process from a liquid state to a gel state. At step 728, the foam may set such as by drying. At step 730, the tooling core may be removed, leaving behind the housing 110 of FIG. 5.

The expandable foam may be sprayed into the interior of the casing 118. Multiple layers of foam may be positioned on top of one another or interlayered with other material such that foam 500 may be a multi-layer wall stiffener and sound damping layer.

Figure 8:
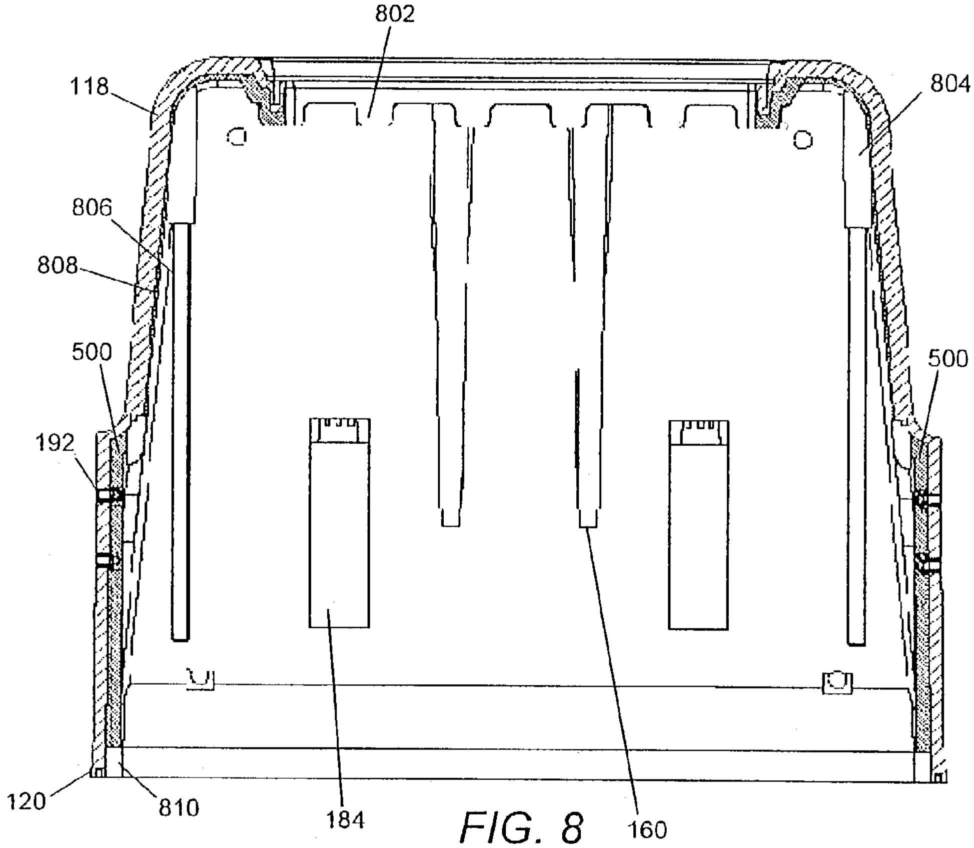
FIG. 8 is a section view taken off line 8—8 of FIG. 6 illustrating a first section of the housing.
Figure 9:
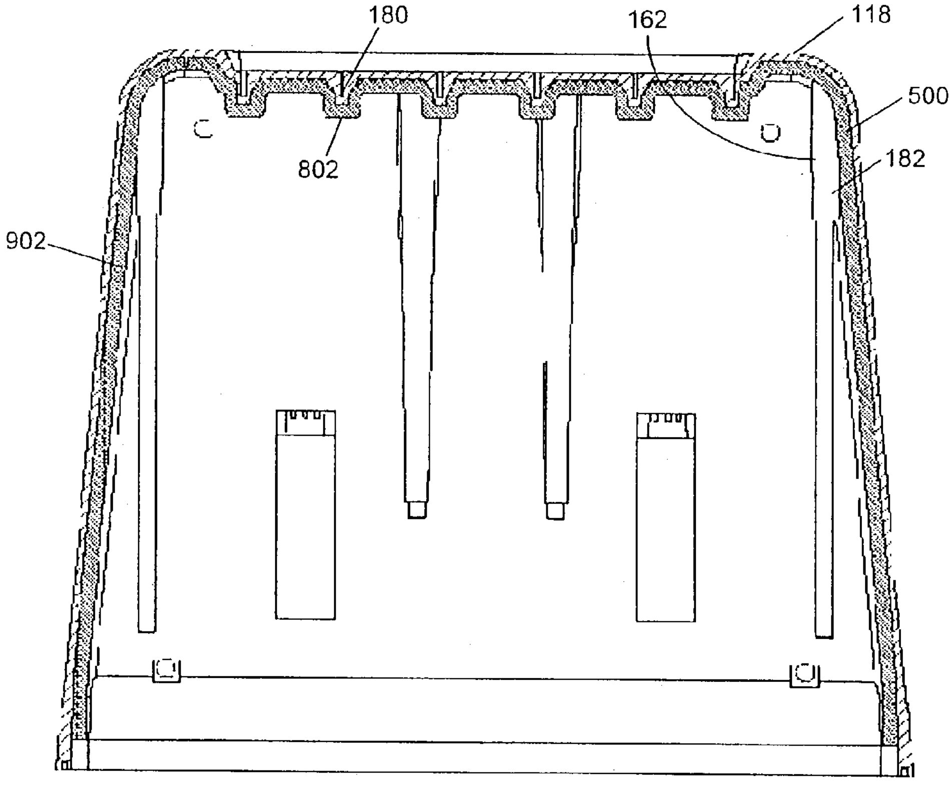
FIG. 9 is a section view taken off line 9—9 of FIG. 6 illustrating a second section of the housing.

FIG. 8 is a section view taken off line 8—8 of FIG. 6 illustrating a first section of the housing 110. FIG. 9 is a section view taken off line 9—9 of FIG. 6 illustrating a second section of the housing 110. A difference between these section views is that the section view for FIG. 8 was taken at the center of the sidewall 134 (FIG. 3) and the sidewall 136. The section view for FIG. 9 was taken at a height of approximately ¼ the length of the sidewall 134.

The foam 500 at region 802 of FIG. 8 may cover the ribs 180 (see FIG. 9). This may function to strengthen the ribs 180. At region 804, the foam 500 may cover the boss 146 (FIG. 4). This may strengthen the boss 146. At region 806, the foam 500 may cover the stud 156 (FIG. 4) to strengthen the stud 156.

In general, the thickness of the foam 500 generally may be a constant thickness as seen at region 810 of FIG. 8. However, the thickness of the foam 500 may be a function of the thickness of the casing 118. For example, region 902 of FIG. 9 shows a general constant thickness. By way of comparison to region 902, region 808 of FIG. 8 is located approximately above region 902. At region 808, the thickness of the foam 500 may be substantially reduced. However, the wall of the casing 118 near region 808 is substantially thicker than the wall of the casing 118 near region 902. Here, both region 902 and region 808 provide the desired wall stiffness and sound damping by accounting for the localized thickness of the casing 118.

Figure 12:
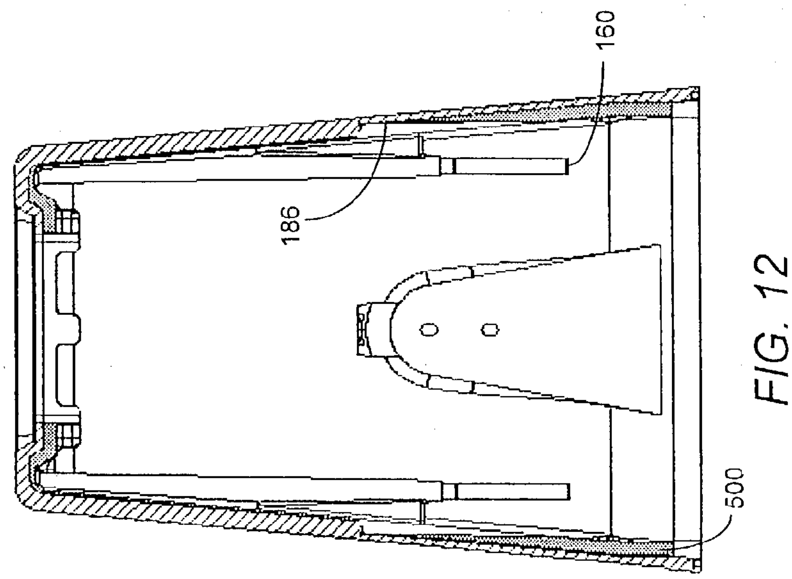
FIG. 12 is a section view taken off line 12—12 of FIG. 6 illustrating a fifth section of the housing.

FIG. 10 is a section view taken off line 10—10 of FIG. 6 illustrating a third section of the housing 110. FIG. 11 is a section view taken off line 11—11 of FIG. 6 illustrating a fourth section of the housing 110. FIG. 12 is a section view taken off line 12—12 of FIG. 6 illustrating a fifth section of the housing 110. FIG. 12 shows the omission of the foam 500 from the nest 186.

As noted above, the bosses 140–154 are subjected to forces, strains, and stresses. The studs 156–170 are subjected to different forces, strains, and stresses not typically found in other sections of the casing 118. Stiffening the studs 156–170 as well as stiffening the bosses 140–154 may react positively against these different forces, strains, and stresses.

When assembled into the casing 118, the studs 156–170 may extend from their associated boss to not touch any surface of the casing 118. To strengthen the studs, a rib made of the foam 500 may be formed. As seen in FIG. 10 and FIG. 11, a rib 1002 may be formed between the stud 158 and the casing 118. The stud 158 may be made of a metal, such as steel. The rib 1002 is made of the material of the foam 500 rather than the material of the casing 118. Here, the foam 500 not only encapsulates the stud 158, but also importantly functions to fix stud 158 to a surface of the casing 118 to stiffen the stud 158. In return, the foam 500 importantly receives strength from the steel stud 158 to perform the wall stiffening and sound dampening job of the foam 500. This symbiotic stiffening feature builds up a tremendous amount of strength. Conventional loudspeaker housings lack this symbiotic stiffening feature.

To test how the housing 110 would perform in a loudspeaker system, the inventor applied a range of sound frequencies to the interior of the casing 118 and measured the resulting decibels. The decibels were measured by applying a laser beam at three locations on the exterior of the casing 118 and measuring the frequency of movement at each location. The first location ("2") was on the sidewall 134. The second location was on the sidewall 136 and the third location was on the top wall 130. The results are indicated in FIG. 13 and FIG. 14.

Figure 13:
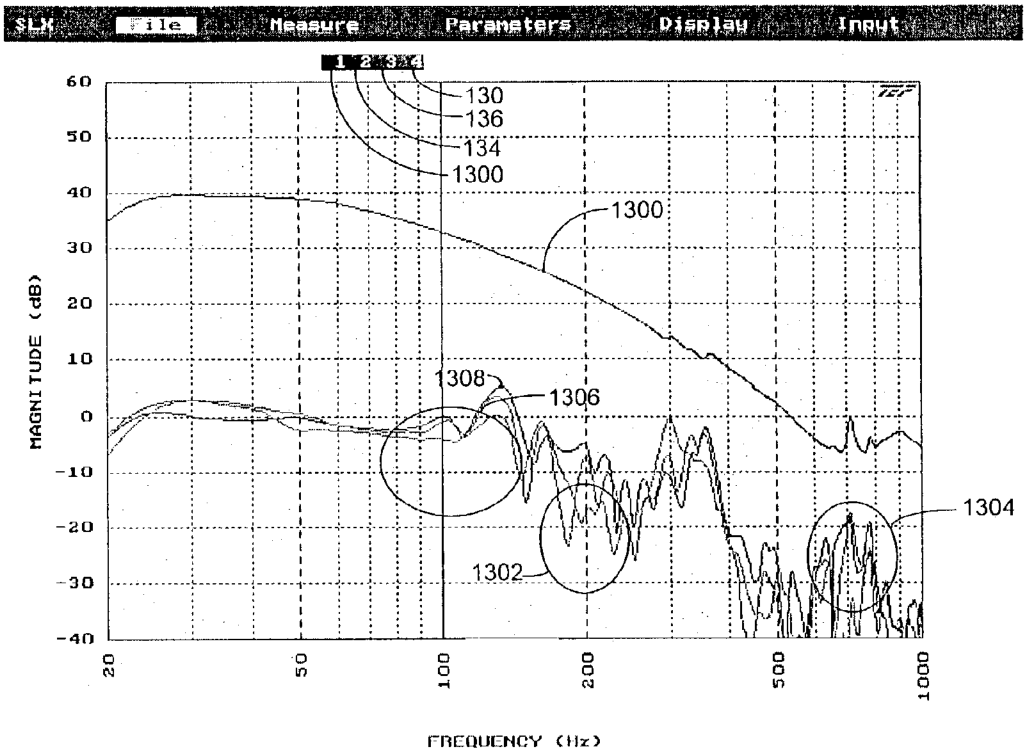
FIG. 13 Is a graph illustrating displacement results of the casing without the foam.
Figure 14:
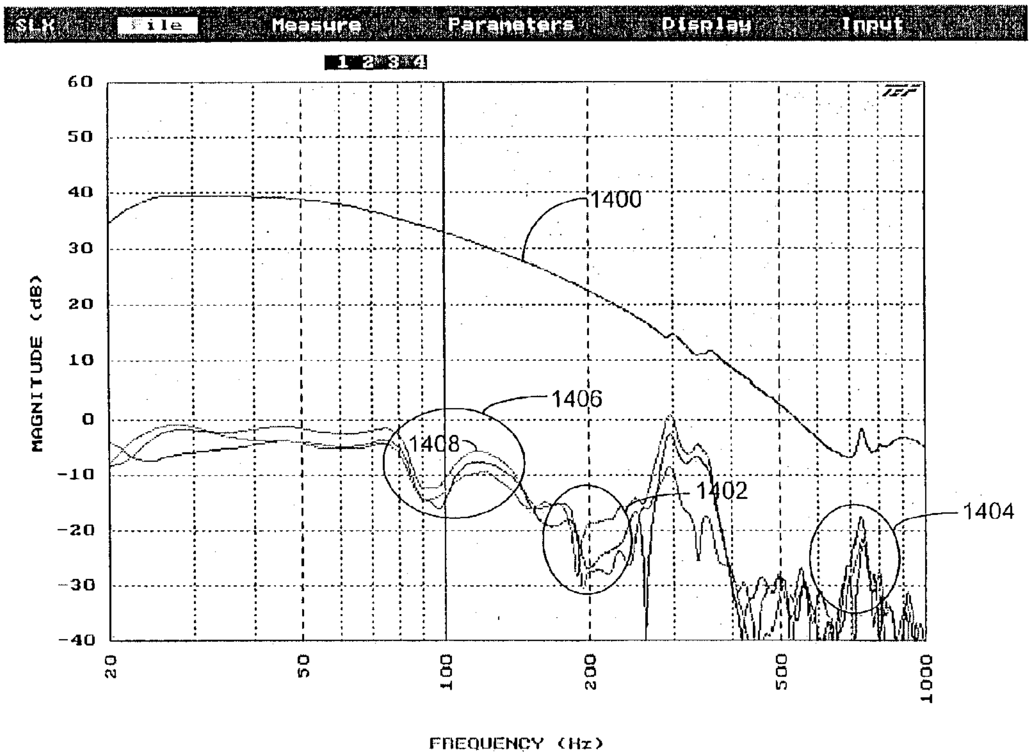
FIG. 14 is a graph illustrating displacement results of the casing where the foam provides sound damping.

FIG. 13 is a graph illustrating displacement results of the casing 118 without the foam 500. FIG. 14 is a graph illustrating displacement results of the casing 118 where the foam 500 provides sound damping. The horizontal abscissa line represents values of input frequency. The vertical ordinate line represents relative values of output decibels. Impedance curves 1300 and 1400 were utilized to verify that the performance of the driver remained the same for each test.

Audible sound ranges from about 100 hertz (Hz) to 20,000 Hz. After about 1,000 Hz, the high frequencies do not affect wall movement. Where the driver 124 (FIG. 2) and the driver 126 provide deep base sounds as subwoofers, an important acoustic area generally is in the region of 200 Hz. Without the utilization of the foam 500, there is a significant amount of acoustic energy (decibels or dB) in the 200 Hz region (identified as region 1302 in FIG. 13). With the foam 500 in place, the acoustic energy generally drops and becomes more controllable as indicated in region 1402 of FIG. 14.

The foam 500 also may control the high 750 Hz frequencies as well. Before damping, there is a great deal of high frequency energy above 500 Hz as seen in the region 1304 of FIG. 13. In region 1304, the acoustic energy reaches approximately −20 dB. In the dampened version of the housing 110, the acoustic energy remains at about −30 dB as seen in region 1404 of FIG. 14.

One surprise was the control offered by the foam 500 at the very low frequencies of 100 Hz. For the dampened version, the acoustic energy drops significantly below zero dB in the region of 100 Hz (region 1406 of FIG. 14). The acoustic energy of the non-dampened version remains at or above zero dB (region 1306 of FIG. 13) almost to the 200 Hz region. In fact, the dampened version smoothed out the five dB peak at region 1308 to about a minus seven dB low lying hill.

In summary of the above, the foam 500 may reduce the amount of acoustic energy emanating outside of the housing 110 beginning at approximately 90 Hz and continuing on through 1,000 Hz. Additionally, the utilization of the foam 500 may increase wall stiffness and provide significant sound damping. The foam 500 functioned exceptionally well in a plastic casing having dimensions of approximately twenty-four inches wide, fourteen inches high, and a depth of twenty-four inches.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A housing for a loudspeaker system, comprising:

a casing that forms an interior; and a foam adhered to the interior of the casing that increases the stiffness of the casing and dampens sounds within the casing, where the foam is a polyurethane foam composition that includes at least one ingredient that reacts to the casing to adhere the foam to the interior of the casing and that includes 40% to 70% by weight diphenylmethane diisocyatuane, 40% to 70% by weight polymeric, and 7% to 13% by weight chlorodifluoromethane.

2. The housing of claim 1, where the casing includes a stud and the foam is positioned between the stud and the casing to form a rib.

3. The housing of claim 2, where the stud is positioned in a boss and the foam is positioned around the stud and the boss.

4. The housing of claim 1, where the casing is made of a high impact polystyrene.

5. The housing of claim 1, where the polyurethane foam composition is crosslinked.

6. The housing of claim 1 where the polyurethane foam composition further includes a catalyst to control a cure rate of the foam.

7. The housing of claim 1, where the foam forms an average thickness of approximately 8.0 to 10.0 millimeters.

8. A loudspeaker system, comprising:

a baffle board;

at least one driver positioned in the baffle board; and a housing including a foam adhered to an interior of a casing that increases the stiffness of the housing and dampens sounds within the casing, where the foam is a polyurethane foam composition that includes means for adhering the foam to the interior of the casing and that includes 40% to 70% by weight diphenylmethane diisocyatuane, 40% to 70% by weight polymeric, and 7% to 13% by weight chlorodifluoromethane.

9. The loudspeaker system of claim 8, where the casing includes a stud and the foam is positioned between the stud and the casing to form a rib.

10. The loudspeaker system of claim 9, where the stud is positioned in a boss and the foam is positioned around the stud.

11. The loudspeaker system of claim 8, where the casing is made of a high impact polystyrene.

12. The loudspeaker system of claim 8, where the polyurethane foam composition is crosslinked.

13. The loudspeaker system of claim 8, where the polyurethane foam composition further includes a catalyst to control a cure rate of the foam.

14. The loudspeaker system of claim 8, where the foam defines an average thickness of approximately 8.0 to 10.0 millimeters.

15. The loudspeaker system of claim 8, where the means for adhering the foam to the interior of the casing is at least one ingredient configured to react with the casing.

16. A method to form a housing of a loudspeaker system, comprising:

positioning a tooling core within an interior of a casing to define a chamber;

placing an expandable foam in the chamber;

expanding the foam so that the foam fills the chamber and reacts with the casing to adhere to the casing; and removing the tooling core from the casing.

17. The method of claim 16, where the casing includes a stud and where expanding the foam positions the foam between the stud and the casing to form a foam rib.

18. The method of claim 17, where the stud is positioned in a boss and where expanding the foam positions the foam around the stud and the boss.

19. The method of claim 18, where the foam defines an average thickness of approximately 8.0 to 10.0 millimeters after the tooling core is removed from the casing.

* * * * *